US008102222B2

(12) United States Patent
Mizutani et al.

(10) Patent No.: US 8,102,222 B2
(45) Date of Patent: Jan. 24, 2012

(54) PASSIVE PART

(75) Inventors: Yasuhiko Mizutani, Komaki (JP); Hitoshi Makino, Saku (JP)

(73) Assignee: Soshin Electric Co., Ltd., Saku (JP)

( * ) Notice: Subject to any disclaimer, the term of this patent is extended or adjusted under 35 U.S.C. 154(b) by 204 days.

(21) Appl. No.: 12/527,718

(22) PCT Filed: Mar. 13, 2008

(86) PCT No.: PCT/JP2008/054604
§ 371 (c)(1),
(2), (4) Date: Aug. 19, 2009

(87) PCT Pub. No.: WO2008/114681
PCT Pub. Date: Sep. 25, 2008

(65) Prior Publication Data
US 2010/0033267 A1    Feb. 11, 2010

(30) Foreign Application Priority Data
Mar. 16, 2007    (JP) .................................. 2007-068959

(51) Int. Cl.
*H03H 7/075*    (2006.01)
*H03H 7/01*    (2006.01)
(52) U.S. Cl. ....................................... 333/175; 333/185
(58) Field of Classification Search .................. 333/175, 333/185, 204
See application file for complete search history.

(56) References Cited

U.S. PATENT DOCUMENTS

| | | | | |
|---|---|---|---|---|
| 5,506,551 A | * | 4/1996 | Kaneko et al. | 333/185 |
| 6,191,666 B1 | * | 2/2001 | Sheen | 333/185 |
| 6,970,057 B2 | * | 11/2005 | Lin et al. | 333/177 |
| 6,998,938 B2 | * | 2/2006 | Lin et al. | 333/177 |
| 7,443,268 B2 | * | 10/2008 | Tsai et al. | 333/175 |

FOREIGN PATENT DOCUMENTS

| | | |
|---|---|---|
| JP | 63-076313 A1 | 4/1988 |
| JP | 09-153703 A1 | 6/1997 |
| JP | 09-153704 A1 | 6/1997 |
| JP | 11-103229 A1 | 4/1999 |
| JP | 2000-049554 A1 | 2/2000 |
| JP | 2003-110393 A1 | 4/2003 |
| JP | 2004-153414 A1 | 5/2004 |
| JP | 2006-093996 A1 | 4/2006 |

* cited by examiner

*Primary Examiner* — Seungsook Ham
(74) *Attorney, Agent, or Firm* — Burr & Brown

(57) ABSTRACT

A first passive part forms a second parallel resonance circuit having a resonance frequency near the passing band among a first to a third parallel resonance circuit as follows. That is, the second parallel resonance circuit is formed at a position farthest from a first shield electrode and farthest from a second shield electrode in a region sandwiched by the first shield electrode and the second shield electrode in a dielectric substrate (in this example, on the main surface of a seventh dielectric layer and the main surface of an eighth dielectric layer located at a center portion in the layering direction of the region).

3 Claims, 8 Drawing Sheets

FIG. 1    10(10A, 10B)

PASSIVE PART

FIELD OF THE INVENTION

The present invention relates to a passive component (passive part) and, for example, concerns a passive component which is suitable for use in a low pass filter or the like, in which a plurality of resonant circuits are connected in series.

BACKGROUND OF THE INVENTION

Recently, for use in mobile communications, portable telephones and the like, a single antenna has come to be used dually for both signal transmission and signal reception.

More specifically, in the case that signals having different frequencies are used for signal transmission and signal reception, a duplexer is connected to the antenna, in which a bandpass filter that passes the transmission signals is used in combination with a bandpass filter that passes the reception signals, whereby the antenna can be utilized in a shared transmitting/receiving manner.

Further, in the case that the transmission signals and the reception signals both use the same frequency, a switching circuit is used, in which by switching between the transmission and reception signals on a timewise axis, the antenna also can be utilized in a shared transmitting/receiving manner.

Additionally, in such a signal transmission/reception apparatus, in particular for improving signal transmission characteristics, a low pass filter may be connected to the transmission side, for example, of a signal transmission/reception switching device.

Incidentally, a device capable of miniaturization, in which ceramic dielectric substrates are used, has been generally adopted as a low pass filter, which is connected to the transmission side of the signal transmission/reception apparatus.

Heretofore, as a low pass filter that utilizes ceramic dielectric substrates, a low pass filter suitable for use in a high frequency band of roughly 1 to 3 GHz has been proposed, having attenuation poles at two-times and three-times the passband, in which the attenuation poles are capable of being adjusted by many parameters, yet in addition, wherein the overall shape of the device can be made smaller in size. (See, for example, Patent Document 1.)

Further, a low pass filter has been proposed which exhibits no vertical directionality, with a structure such that, even if the filter is mounted with the vertical orientation thereof switched, electrical characteristics thereof are not changed. (See, for example, Patent Document 2.)

Patent Document 1: Japanese Laid-Open Patent Publication No. 2004-153414.

Patent Document 2: Japanese Laid-Open Patent Publication No. 2003-110393.

SUMMARY OF THE INVENTION

Incidentally, in such conventional low pass filters, in which a ceramic dielectric substrate is used, a structure is provided in which simply the attenuation poles thereof are increased, or in which the electrical characteristics thereof are not subject to change even if the device is mounted in a vertically switched condition. Nothing has been devised concerning a method for increasing the Q-value of a resonant circuit that forms an attenuation pole in the vicinity of the passband in a multi-stage low pass filter.

More specifically, for example, in a high order low pass filter having a plurality of coil patterns, for incorporating a plurality of coil patterns into a single dielectric substrate, a situation has been considered in which the coil patters are formed randomly in an upper portion, a lower portion, and a central portion of the dielectric substrate.

Due to the fact that shield electrodes are formed at upper and lower portions of the dielectric substrate, when the plural coil patterns are arranged randomly, some coil patterns are formed in the vicinity of the shield electrodes, which tends to worsen the Q-value of the resonant circuit having such coil patterns therein. When the Q-value of the resonant circuit becomes degraded, problems occur in that insertion losses increase, while widening of the passband and sharp attenuation characteristics cannot be obtained.

The present invention has been devised while taking into consideration such problems. The present invention has the object of providing a passive component in which increases in insertion loss are suppressed, the passband is widened, and steep attenuation characteristics can be obtained, even in situations where a high order low pass filter is constituted having a plurality of coil patterns therein.

A passive component according to the present invention comprises a dielectric substrate constituted from a stack of plural dielectric layers, wherein a first shield electrode is formed on an upper portion thereof, and a second shield electrode is formed on a lower portion thereof, and a plurality of LC resonant circuits formed in a region within the dielectric substrate, the region being sandwiched between the first shield electrode and the second shield electrode. In at least one of the LC resonant circuits that has a resonant frequency near to a passband, at least a coil is formed in the region at a position farthest from the first shield electrode and the second shield electrode. Moreover, the LC resonant circuit indicates a lumped constant circuit, constituted by a coil (L) and a capacitor (C).

As a result thereof, by forming the LC resonant circuit at a position that is farthest from the first shield electrode and the second shield electrode, the electrodes constituting the LC resonant circuit (for example, coil-forming electrodes and capacitor-forming electrodes) are less subject to the first shield electrode and the second shield electrode, whereby the Q-value of the LC resonant circuit is enhanced. This is equivalent to use of an LC resonant circuit having a high Q-value in order to form an attenuation pole in the vicinity of the passband, and by forming a plurality of LC resonant circuits inside of the dielectric substrate, an increase in insertion loss can be suppressed, the passband can be widened, and steep attenuation characteristics can be obtained.

Additionally, in the present invention, in all of the plurality of LC resonant circuits, at least a coil may be formed in the region at a position farthest from the first shield electrode and the second shield electrode. In this case, due to the fact that all LC resonant circuits are less subject to the first shield electrode and the second shield electrode, the Q-value of the plurality of LC resonant circuits can be enhanced, and moreover, a low profile can be realized. The device therefore is suitable for use in thin-bodied communication devices and electronic equipment.

Further, in the present invention, each of the LC resonant circuits may be a parallel resonant circuit having coil-forming electrodes constituting a coil and capacitor-forming electrodes constituting a capacitor. In this case, preferably, the coil-forming electrodes are formed over a plurality of dielectric layers, while the capacitor-forming electrodes are formed on at least one or more of the coil-forming electrodes thereamong. As a result, miniaturization and a low profile can be promoted.

Further, in the present invention, a ground capacitor electrode which is at the same potential as the capacitor-forming electrodes may be formed between the dielectric layers in which the LC resonant circuits are formed and the dielectric layer in which the first shield electrode or the second shield electrode is formed, and at a position corresponding to the capacitor-forming electrodes. In this case, an effect of lowering floating (stray) capacitance is achieved, and the degree of freedom in design of the device is enhanced.

Further, in the present invention, when the dielectric substrate is viewed from an upper surface thereof, the plural LC resonant circuits are arranged in a row, and in adjacent LC resonant circuits, the winding directions of the coil-forming electrodes thereof may be opposite to each other. In this case, there is an effect of reduction of coupling. As a result, the adjacent LC resonant circuits can be disposed closely to one another, whereby miniaturization can be further promoted.

As described above, in accordance with the passive component of the present invention, increases in insertion loss are suppressed, the passband is widened, and steep attenuation characteristics can be obtained, even in situations where a high order low pass filter is constituted having a plurality of coil patterns therein.

DETAILED DESCRIPTION OF THE INVENTION

Below, an embodiment of a passive component according to the present invention shall be described with reference to FIGS. 1 through 8.

Figure 1:
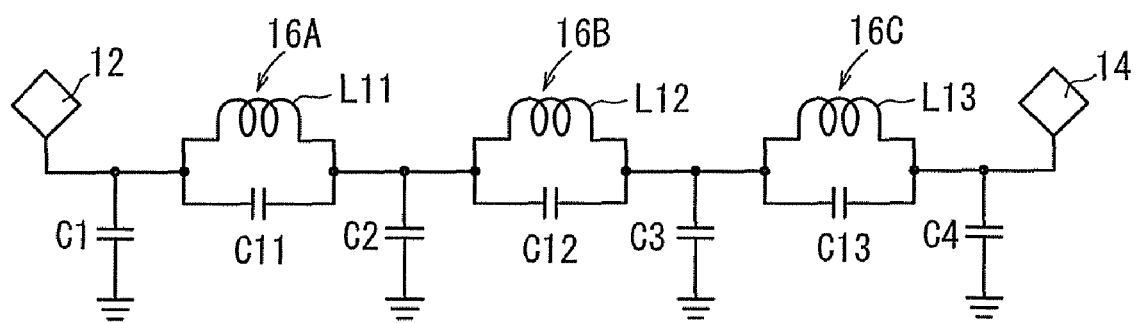
FIG. 1 is a circuit diagram showing a passive component according to an embodiment of the present invention.

First, as shown in FIG. 1, the circuit structure of the passive component according to the present embodiment is configured such that three parallel resonant circuits (first parallel resonant circuit 16A, second parallel resonant circuit 16B, third parallel resonant circuit 16C) are connected in series between an input terminal 12 and an output terminal 14, a first capacitor C1 is connected between the input terminal 12 and GND (ground), a second capacitor C2 is connected between GND and a junction of the first parallel resonant circuit 16A and the second parallel resonant circuit 16B, a third capacitor C3 is connected between GND and a junction of the second parallel resonant circuit 16B and the third parallel resonant circuit 16C, and a fourth capacitor C4 is connected between the output terminal 14 and GND.

The first parallel resonant circuit 16A is constituted by connecting in parallel an eleventh coil L11 and an eleventh capacitor C1, the second parallel resonant circuit 16B is constituted by connecting in parallel a twelfth coil L12 and a twelfth capacitor C12, and the third parallel resonant circuit 16C is constituted by connecting in parallel a thirteenth coil L13 and a thirteenth capacitor C13.

Figure 2:
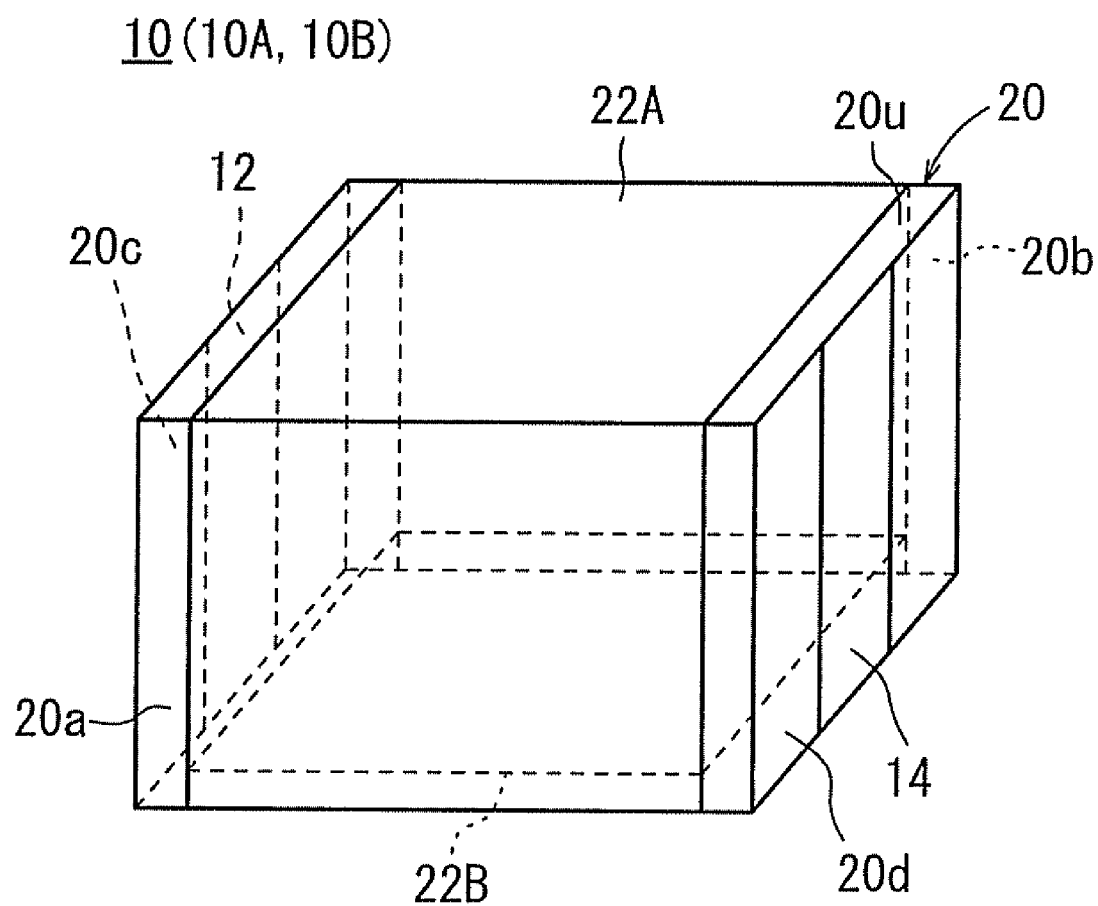
FIG. 2 is an exterior perspective view showing a first passive component and a second passive component.

Additionally, as shown in FIG. 2, a passive component according to a first detailed example (hereinafter referred to as a first passive component 10A) includes a dielectric substrate 20 in which a plurality of dielectric layers (dielectric layers S1 to S14; refer to FIG. 3) are stacked and sintered together integrally. A first shield electrode 22A is formed on the upper surface 20u of the dielectric substrate 20, and a second shield electrode 22B is formed on a principal surface of a fourteenth dielectric layer S14 (see FIG. 3). The first shield electrode 22A and the second shield electrode 22B are connected by a first side surface 20a and a second side surface 20b (a surface on an opposite side from the first side surface 20a) of the dielectric substrate 20. Further, an input terminal 12 is formed on a third side surface 20c of the dielectric substrate 20, and an output terminal 14 is formed on a fourth side surface 20d (a surface on an opposite side from the third side surface 20c) of the dielectric substrate 20.

Figure 3:
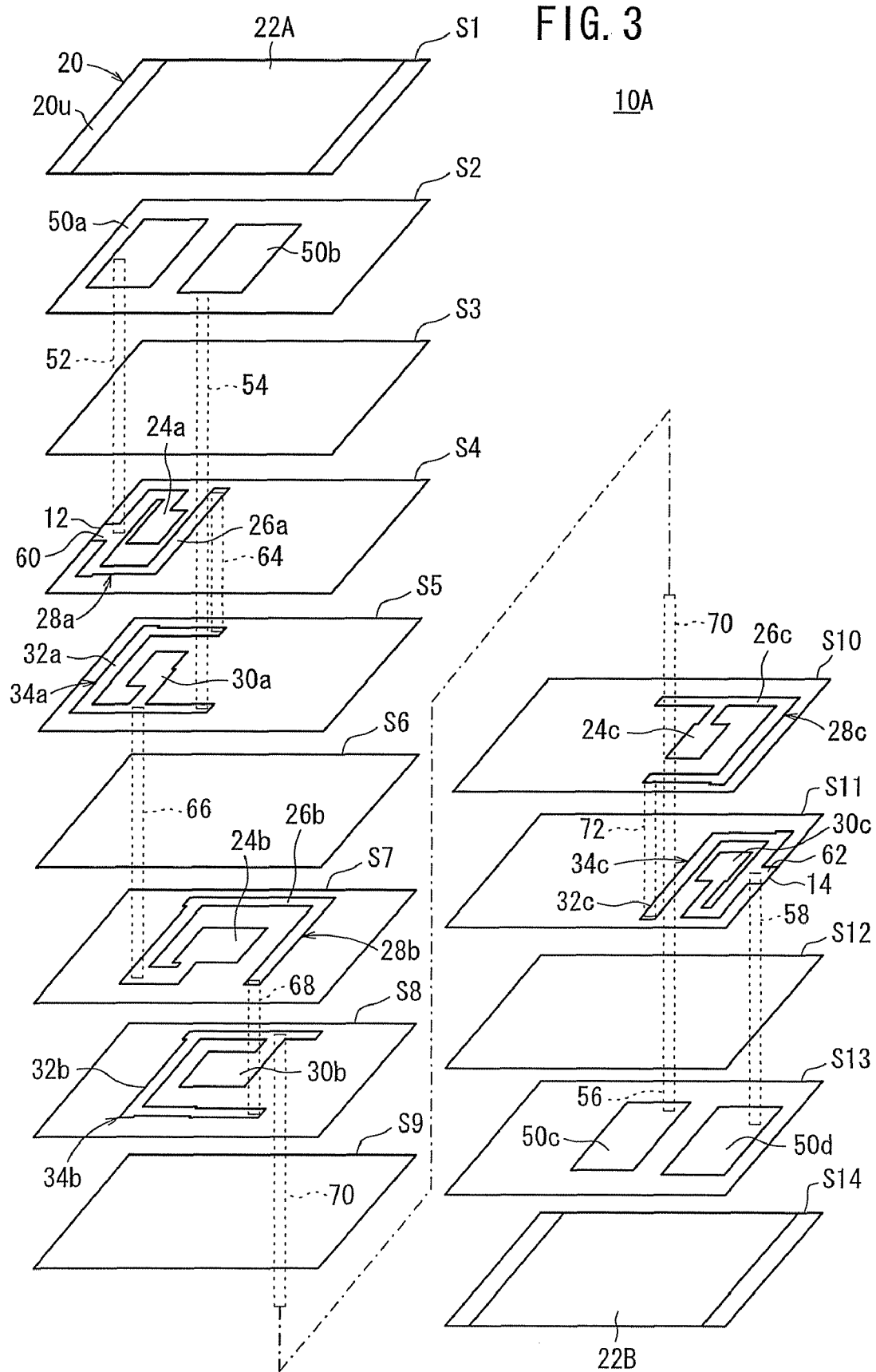
FIG. 3 is an exploded perspective view showing the first passive component.

As shown in FIG. 3, the dielectric substrate 20 is constituted by stacking in order from the upper side thereof the first dielectric layer S1 through the fourteenth dielectric layer S14. The first dielectric layer S1 through the fourteenth dielectric layer S14 each constitute a layer made up of a single sheet or multiple sheets.

In addition, on a principal surface of the fourth dielectric layer S4, an eleventh electrode pattern 28a is formed, in which an eleventh capacitor-forming electrode 24a for forming the eleventh capacitor C11 of the first parallel resonant circuit 16A and an eleventh coil-forming electrode 26a for forming the eleventh coil L11 of the first parallel resonant circuit 16A are electrically connected.

On a principal surface of the fifth dielectric layer S5, a twenty-first electrode pattern 34a is formed, in which a twenty-first capacitor-forming electrode 30a for forming the eleventh capacitor C11 of the first parallel resonant circuit 16A and a twenty-first coil-forming electrode 32a for forming the eleventh coil L11 of the first parallel resonant circuit 16A are electrically connected.

Similarly, on a principal surface of the seventh dielectric layer S7, a twelfth electrode pattern 28b is formed, in which a twelfth capacitor-forming electrode 24b for forming the twelfth capacitor C12 of the second parallel resonant circuit 16B and a twelfth coil-forming electrode 26b for forming the twelfth coil L12 of the second parallel resonant circuit 16B are electrically connected.

On a principal surface of the eighth dielectric layer S8, a twenty-second electrode pattern 34b is formed, in which a twenty-second capacitor-forming electrode 30b for forming the twelfth capacitor C12 of the second parallel resonant circuit 16B and a twenty-second coil-forming electrode 32b for forming the twelfth coil L12 of the second parallel resonant circuit 16B are electrically connected.

Furthermore, on a principal surface of the tenth dielectric layer S10, a thirteenth electrode pattern 28c is formed, in which a thirteenth capacitor-forming electrode 24c for forming the thirteenth capacitor C13 of the third parallel resonant circuit 16C and a thirteenth coil-forming electrode 26c for forming the thirteenth coil L13 of the third parallel resonant circuit 16C are electrically connected.

On a principal surface of the eleventh dielectric layer S11, a twenty-third electrode pattern 34c is formed, in which a twenty-third capacitor-forming electrode 30c for forming the thirteenth capacitor C13 of the third parallel resonant circuit 16C and a twenty-third coil-forming electrode 32c for forming the thirteenth coil L13 of the third parallel resonant circuit 16C are electrically connected.

The input terminal 12 is connected electrically through a lead electrode 60 to the eleventh coil-forming electrode 26a of the eleventh electrode pattern 28a, whereas the output terminal 14 is connected electrically through a lead electrode 62 to the twenty-third coil-forming electrode 32c of the twenty-third electrode pattern 34c.

Further, on a principal surface of the second dielectric layer S2, at a location corresponding to the eleventh capacitor-forming electrode 24a, a first ground capacitor electrode 50a is formed, which is at the same potential as the eleventh capacitor-forming electrode 24a, and which serves to form the first capacitor C1. Also on the principal surface of the second dielectric layer S2, at a location corresponding to the twelfth capacitor-forming electrode 24b, a second ground capacitor electrode 50b is formed, which is at the same potential as the twelfth capacitor-forming electrode 24b, and which serves to form the second capacitor C2. Similarly, on a principal surface of the thirteenth dielectric layer S13, at a location corresponding to the twenty-second capacitor-forming electrode 30b, a third ground capacitor electrode 50c is formed, which is at the same potential as the twenty-second capacitor-forming electrode 30b, and which serves to form the third capacitor C3. Also on the principal surface of the thirteenth dielectric layer S13, at a location corresponding to the twenty-third capacitor-forming electrode 30c, a fourth ground capacitor electrode 50d is formed, which is at the same potential as the twenty-third capacitor-forming electrode 30c, and which serves to form the fourth capacitor C4.

More specifically, the eleventh capacitor-forming electrode 24a is connected to one end of the U-shaped eleventh coil-forming electrode 26a, another end of the eleventh coil-forming electrode 26a is connected electrically through a via hole 64 with one end of the U-shaped twenty-first coil-forming electrode 32a, and an interconnected part of the eleventh coil-forming electrode 26a and the lead electrode 60 is connected electrically through a via hole 52 with the first capacitor electrode 50a.

Further, the other end of the twenty-first coil-forming electrode 32a is connected electrically through a via hole 54 with the second capacitor electrode 50b, the twenty-first capacitor-forming electrode 30a is formed at a region which is proximate to the other end of the twenty-first coil-forming electrode 32a, and an interconnecting portion between the twenty-first coil-forming electrode 32a and the twenty-first capacitor-forming electrode 30a is connected electrically through a via hole 66 with one end of the U-shaped twelfth coil-forming electrode 26b.

The twelfth capacitor-forming electrode 24b is connected to one end of the twelfth coil-forming electrode 26b, the other end of the twelfth coil-forming electrode 26b is connected electrically through a via hole 68 with one end of the U-shaped twenty-second coil-forming electrode 32b, and the twenty-second capacitor-forming electrode 30b is connected to a region which is proximate to the other end of the twenty-second coil-forming electrode 32b.

An interconnected portion between the twenty-second coil-forming electrode 32b and the twenty-second capacitor-forming electrode 30b is connected electrically through a via hole 70 with one end of the U-shaped thirteenth coil-forming electrode 26c, the one end thereof being connected electrically through another via hole 56 with the third capacitor electrode 50c. The thirteenth capacitor-forming electrode 24c is connected to a portion which is proximate to the one end of the thirteenth coil-forming electrode 26c, and the other end of the thirteenth coil-forming electrode 26c is connected electrically through a via hole 72 with one end of the U-shaped twenty-third coil-forming electrode 32c.

An interconnected portion between the twenty-third coil-forming electrode 32c and the lead electrode 62 is connected electrically through a via hole 58 with the fourth capacitor electrode 50d.

Next, the circuit structure of the first passive component 10A shall be explained in correspondence with the circuit shown in FIG. 1.

First, the first capacitor C1 is formed by the first capacitor electrode 50a, which is formed on the principal surface of the second dielectric layer S2, and the first shield electrode 22A, which is formed on the principal surface of the first dielectric layer S1 (i.e., the upper surface 20u of the dielectric substrate 20), whereas the second capacitor C2 is formed by the second capacitor electrode 50b and the first shield electrode 22A. Similarly, the third capacitor C3 is formed by the third capacitor electrode 50c, which is formed on the principal surface of the thirteenth dielectric layer S13, and the second shield electrode 22B, which is formed on the principal surface of the fourteenth dielectric layer S14, whereas the fourth capacitor C4 is formed by the fourth capacitor electrode 50d and the second shield electrode 22B.

The eleventh capacitor C11 of the first parallel resonant circuit 16A is formed by the eleventh capacitor-forming electrode 24a, which is formed on the principal surface of the fourth dielectric layer S4, and the twenty-first capacitor-forming electrode 30a, which is formed on the principal surface of the fifth dielectric layer, whereas the eleventh coil L11 of the first parallel resonant circuit 16A is formed by the eleventh coil-forming electrode 26a, which is formed on the principal surface of the fourth dielectric layer S4, the via hole 64, and the twenty-first coil-forming electrode 32a, which is formed on the principal surface of the fifth dielectric layer S5.

Similarly, the twelfth capacitor C12 of the second parallel resonant circuit 16B is formed by the twelfth capacitor-forming electrode 24b, which is formed on the principal surface of the seventh dielectric layer S7, and the twenty-second capacitor-forming electrode 30b, which is formed on the principal surface of the eighth dielectric layer S8, whereas the twelfth coil L12 of the second parallel resonant circuit 16B is formed by the twelfth coil-forming electrode 26b, which is formed on the principal surface of the seventh dielectric layer S7, the via hole 68, and the twenty-second coil-forming electrode 32b, which is formed on the principal surface of the eighth dielectric layer S8.

Furthermore, the thirteenth capacitor C13 of the third parallel resonant circuit 16C is formed by the thirteenth capacitor-forming electrode 24c, which is formed on the principal surface of the tenth dielectric layer S10, and the twenty-third capacitor-forming electrode 30c, which is formed on the principal surface of the eleventh dielectric layer S11, whereas the thirteenth coil L13 of the third parallel resonant circuit 16C is formed by the thirteenth coil-forming electrode 26c, which is formed on the principal surface of the tenth dielectric layer S10, the via hole 72, and the twenty-third coil-forming electrode 32c, which is formed on the principal surface of the eleventh dielectric layer S11.

Figure 4:
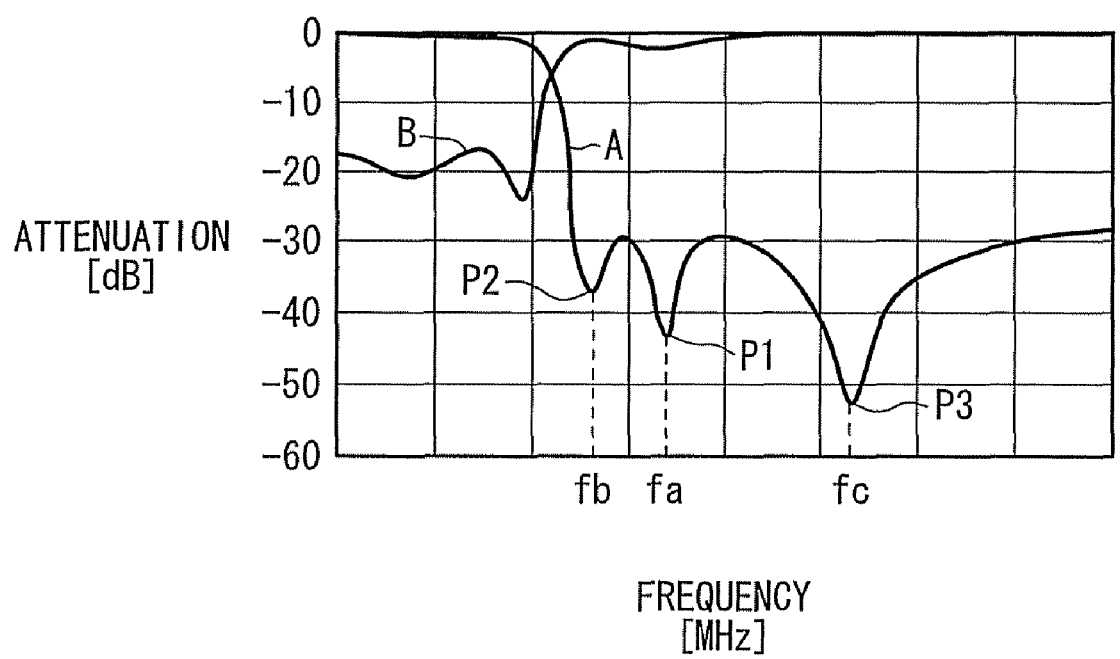
FIG. 4 is a diagram illustrating frequency characteristics of a passive component (first passive component and second passive component) according to the present embodiment.

FIG. 4 illustrates exemplary frequency characteristics of the first passive component 10A. In FIG. 4, the solid line A indicates bandpass characteristics, and the solid line B indicates reflection characteristics. Three attenuation poles (first through third attenuation poles P1 to P3) are formed in the bandpass characteristics. Thereamong, the second attenuation pole P2 (resonant frequency fb) which is nearest to the passband is caused by the second parallel resonant circuit 16B. Apart therefrom, the first attenuation pole P1 (resonant frequency fa) and the third attenuation pole P3 (resonant frequency fc) are caused respectively by the first parallel resonant circuit 16A and the third parallel resonant circuit 16C.

Figure 5:
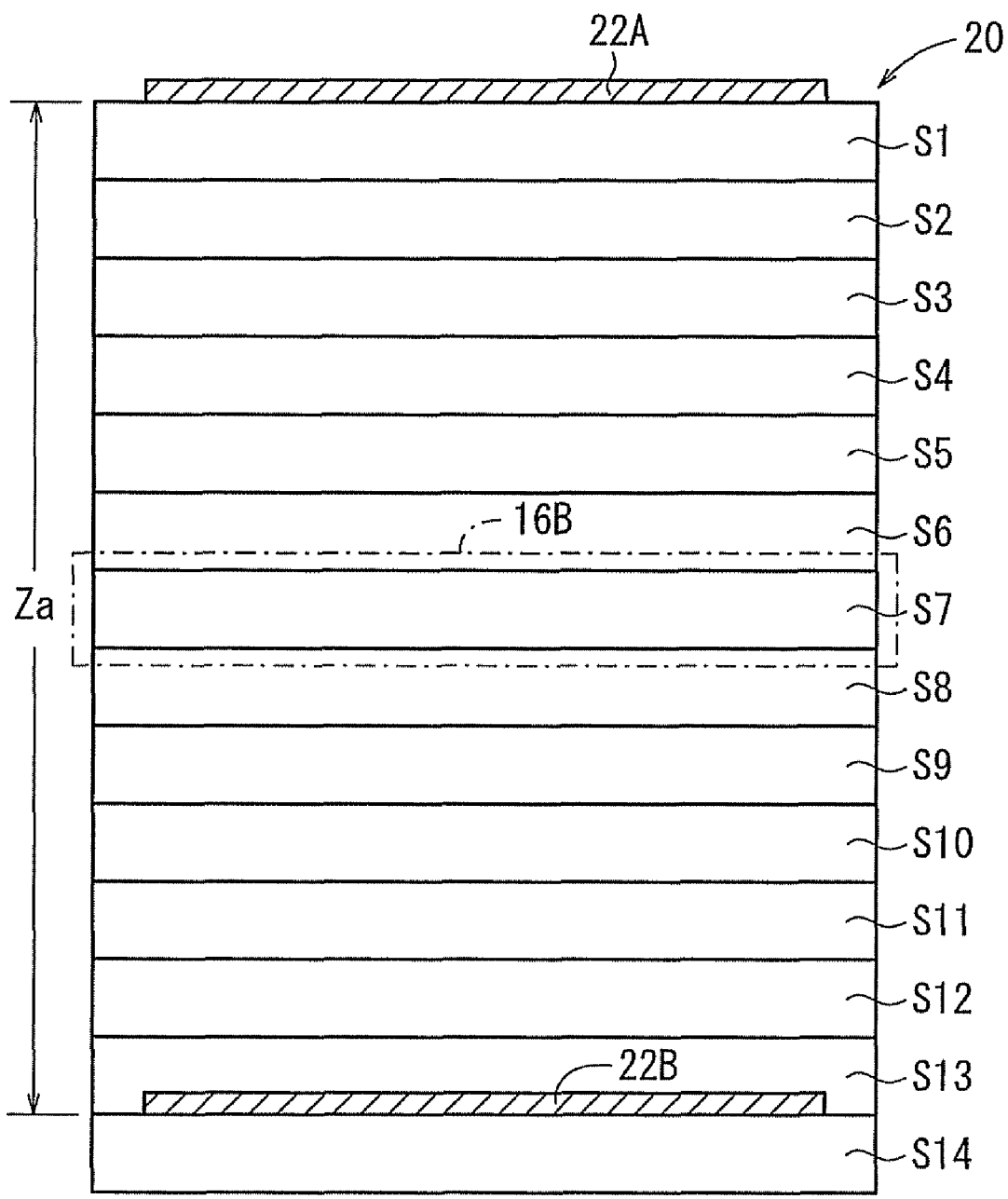
FIG. 5 is a view for explaining a position, which is farthest from a first shield electrode and a second shield electrode, in the first passive component.

In this manner, in the first passive component 10A, among the first to third parallel resonant circuits 16A to 16C, the second parallel resonant circuit 16B having a resonant frequency (second attenuation pole P2) near to the passband is formed at the following position. More specifically, for example, as shown in FIG. 5, the second parallel resonant circuit 16B is formed in the dielectric substrate 20 at a position farthest from the first shield electrode 22A, and farthest from the second shield electrode 22B, within a region Za sandwiched between the first shield electrode 22A and the second shield electrode 22B.

Herein, the farthest position is defined such that, in the first passage component 10A, since the number of dielectric layers which are included in the region Za is an odd number (i.e., thirteen layers: first through third dielectric layers S1 to S13), the farthest position applies to the principal surface of the seventh dielectric layer S7 and the principal surface of the eight dielectric layer S8, which are positioned at a center portion in the stacking direction of the region Za.

Consequently, the electrodes that constitute the second parallel resonant circuit 16B (e.g., the twelfth capacitor-forming electrode 24b, the twelfth coil-forming electrode 26b, the twenty-second capacitor-forming electrode 30b, and the twenty-second coil-forming electrode 32b, etc.) are less subject to the first shield electrode 22A and the second shield electrode 22B which are formed respectively at the upper portion and the lower portion of the dielectric substrate 20, and the Q-value of the second parallel resonant circuit 16B is improved. This is equivalent to use of the second parallel resonant circuit 16B having a high Q-value in order to form an attenuation pole P2 in the vicinity of the passband, and by forming the first through third parallel resonant circuits 16A to 16C inside of the dielectric substrate 20, an increase in insertion loss can be suppressed. As a result, the passband can be widened, and steep attenuation characteristics can be obtained.

Further, each of the coil-forming electrodes (26a to 26c, 32a to 32c) and each of the capacitor-forming electrodes (24a to 24c, 30a to 30c) are not formed in separate dielectric layers, but rather, each of the capacitor-forming electrodes (24a to 24c, 30a to 30c) is arranged within an orbit of each of the coil-forming electrodes (26a to 26c, 32a to 32c). Further, each of the capacitor-forming electrodes (24a to 24c, 30a to 30c) is connected to a corresponding coil-forming electrode (26a to 26c, 32a to 32c). Thus, capacitor-forming electrodes (24a to 24c, 30a to 30c) which correspond respectively to the coil-forming electrodes (26a to 26c, 32a to 32c), are formed, thereby enabling miniaturization and a low profile of the first passive component 10A to be promoted.

Further, in the first passive component 10A, between the fourth through eleventh dielectric layers S4 to S11 in which the first through third parallel resonant circuits 16A to 16C are formed and the first dielectric layer S1 on which the first shield electrode 22A is formed, the first capacitor electrode 50a at the same potential as the eleventh capacitor-forming electrode 24a is formed at a position corresponding to the eleventh capacitor-forming electrode 24a, whereas the second capacitor electrode 50b at the same potential as the twelfth capacitor-forming electrode 24b is formed at a position corresponding to the twelfth capacitor-forming electrode 24b. Furthermore, between the fourth through eleventh dielectric layers S4 to S11 in which the first through third parallel resonant circuits 16A to 16C are formed and the fourteenth dielectric layer S14 on which the second shield electrode 22B is formed, the third capacitor electrode 50c at the same potential as the twenty-second capacitor-forming electrode 30b is formed at a position corresponding to the twenty-second capacitor-forming electrode 30b, whereas the fourth capacitor electrode 50d at the same potential as the twenty-third capacitor-forming electrode 30c is formed at a position corresponding to the twenty-third capacitor-forming electrode 30c. Owing thereto, an effect of lowering floating (stray) capacitance is achieved, and the degree of freedom in design of the device is enhanced.

Figure 6:
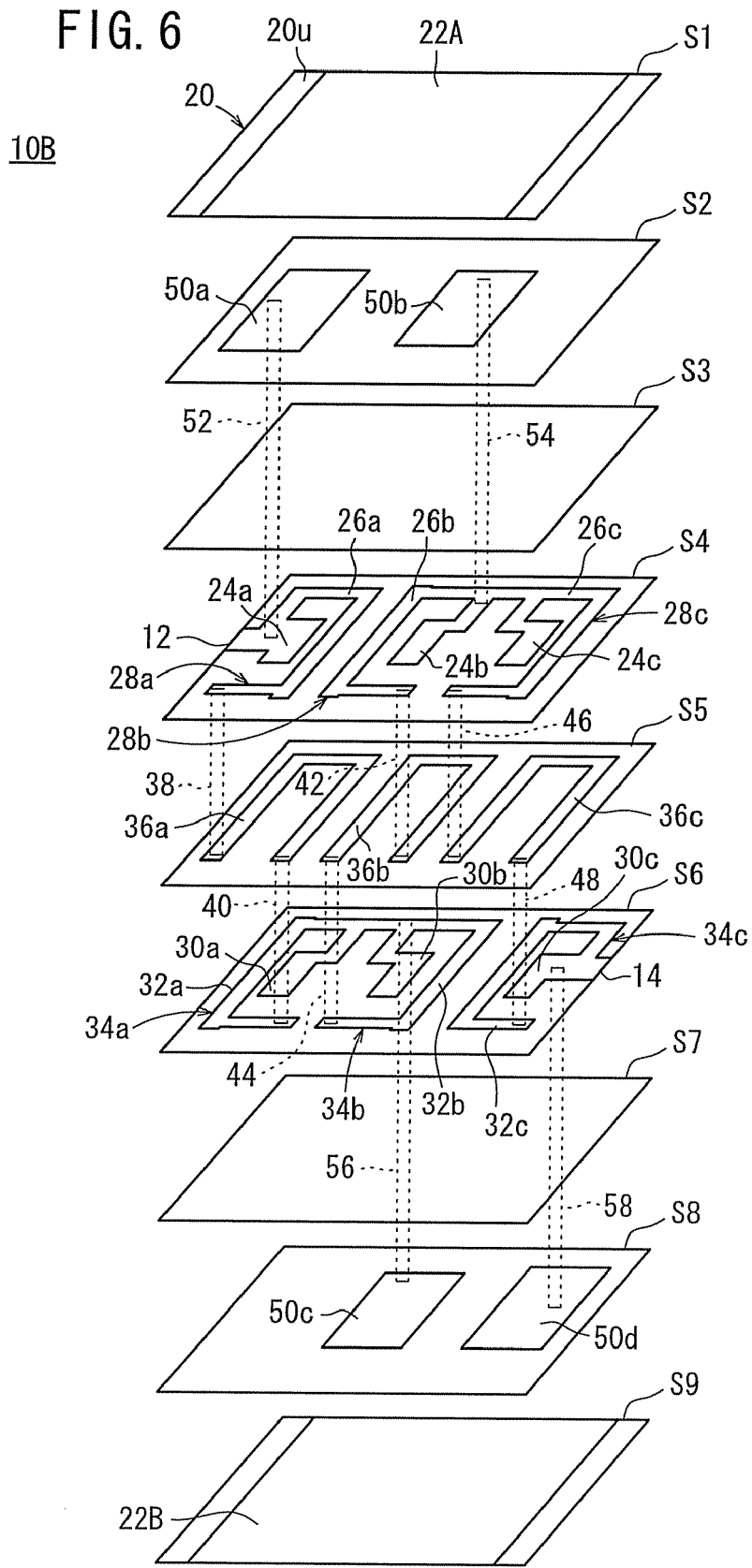
FIG. 6 is an exploded perspective view showing the second passive component.

Next, a passive component according to a second detailed example (hereinafter referred to as a second passive component 10B) shall be explained with reference to FIG. 6. As shown in FIG. 6, the second passive component 10B is substantially the same as the aforementioned first passive component 10A, but differs therefrom in the following points described below.

More specifically, as shown in FIG. 6, the dielectric substrate 20 is constituted by stacking in order from the upper side thereof a first dielectric layer S1 through a ninth dielectric layer S9. The first dielectric layer S1 through the ninth dielectric layer S9 each constitute a layer made up of a single sheet or multiple sheets. A first shield electrode 22A is formed on a principal surface (an upper surface 20u of the dielectric substrate 20) of the first dielectric layer S1, whereas a second shield electrode 22B is formed on a principal surface of the ninth dielectric layer S9.

Additionally, an eleventh electrode pattern 28a, in which an eleventh capacitor-forming electrode 24a is connected electrically with an eleventh coil-forming electrode 26a, a twelfth electrode pattern 28b, in which a twelfth capacitor-forming electrode 24b is connected electrically with a twelfth coil-forming electrode 26b, and a thirteenth electrode pattern 28c, in which a thirteenth capacitor-forming electrode 24c is connected electrically with a thirteenth coil-forming electrode 26c, are formed on a principal surface of the fourth dielectric layer S4.

In this case, an input terminal 12 is connected electrically to one end of the eleventh capacitor-forming electrode 24a of the eleventh electrode pattern 28a. Further, the twelfth coil-forming electrode 26b of the twelfth electrode pattern 28b is connected integrally with the thirteenth coil-forming electrode 26c of the thirteenth electrode pattern 28c, thereby forming a C-shaped electrode pattern as a whole.

Similarly, a twenty-first electrode pattern 34a, in which a twenty-first capacitor-forming electrode 30a is connected electrically with a twenty-first coil-forming electrode 32a, a twenty-second electrode pattern 34b, in which a twenty-second capacitor-forming electrode 30b is connected electrically with a twenty-second coil-forming electrode 32b, and a twenty-third electrode pattern 34c, in which a twenty-third capacitor-forming electrode 30c is connected electrically with a twenty-third coil-forming electrode 32c, are formed on a principal surface of the sixth dielectric layer S6.

In this case, an output terminal 14 is connected electrically to one end of the twenty-third capacitor-forming electrode 30c of the twenty-third electrode pattern 34c. Further, the twenty-first coil-forming electrode 32a of the twenty-first electrode pattern 34a is connected integrally with the twenty-second coil-forming electrode 32b of the twenty-second electrode pattern 34b, thereby forming a C-shaped electrode pattern as a whole.

Furthermore, a U-shaped thirty-first coil-forming electrode 36a, a U-shaped thirty-second coil-forming electrode 36b, and a U-shaped thirty-third coil-forming electrode 36c are formed on the principal surface of the fifth dielectric layer S5.

Thereamong, one end of the thirty-first coil-forming electrode 36a is connected electrically through a via hole 38 with one end of the eleventh coil-forming electrode 26a, whereas the other end of the thirty-first coil-forming electrode 36a is connected electrically through a via hole 40 with one end of the twenty-first coil-forming electrode 32a.

Similarly, one end of the thirty-second coil-forming electrode 36b is connected electrically through a via hole 42 with one end of the twelfth coil-forming electrode 26b, whereas the other end of the thirty-second coil-forming electrode 36b is connected electrically through a via hole 44 with one end of the twenty-second coil-forming electrode 32b.

Furthermore, one end of the thirty-third coil-forming electrode 36c is connected electrically through a via hole 46 with one end of the thirteenth coil-forming electrode 26c, whereas the other end of the thirty-third coil-forming electrode 36c is connected electrically through a via hole 48 with one end of the twenty-third coil-forming electrode 32c.

Further, on a principal surface of the second dielectric layer S2, at a location corresponding to the eleventh capacitor-forming electrode 24a, a first capacitor electrode 50a is formed, which is at the same potential as the eleventh capacitor-forming electrode 24a. Also on the principal surface of the second dielectric layer S2, at a location corresponding to the twelfth capacitor-forming electrode 24b, a second capacitor electrode 50b is formed, which is at the same potential as the twelfth capacitor-forming electrode 24b. The first capacitor electrode 50a is connected electrically through a via hole 52 with the eleventh capacitor-forming electrode 24a, whereas the second capacitor electrode 50b is connected electrically through a via hole 54 with the twelfth capacitor-forming electrode 24b. The first capacitor electrode 50a faces the first shield electrode 22A with the first dielectric layer S1 interposed therebetween, and the second capacitor electrode 50b also faces the first shield electrode 22A with the first dielectric layer S1 interposed therebetween.

Similarly, on a principal surface of the eighth dielectric layer S8, at a location corresponding to the twenty-second capacitor-forming electrode 30b, a third capacitor electrode 50c is formed, which is at the same potential as the twenty-second capacitor-forming electrode 30b. Also on the principal surface of the eighth dielectric layer S8, at a location corresponding to the twenty-third capacitor-forming electrode 30c, a fourth capacitor electrode 50d is formed, which is at the same potential as the twenty-third capacitor-forming electrode 30c. The third capacitor electrode 50c is connected electrically through a via hole 56 with the twenty-second capacitor-forming electrode 30b, whereas the fourth capacitor electrode 50d is connected electrically through a via hole 58 with the twenty-third capacitor-forming electrode 30c. The above-mentioned third capacitor electrode 50c and fourth capacitor electrode 50d each face the second shield electrode 22B with the eighth dielectric layer S8 interposed between the second shield electrode 22B and the third and fourth capacitor electrodes 50c, 50d.

Next, the circuit structure of the second passive component 10B shall be explained in correspondence with the circuit shown in FIG. 1.

First, the first capacitor C1 is formed by the first capacitor electrode 50a, which is formed on the principal surface of the second dielectric layer S2, and the first shield electrode 22A, which is formed on the upper surface 20u of the dielectric substrate, whereas the second capacitor C2 is formed by the second capacitor electrode 50b and the first shield electrode 22A. Similarly, the third capacitor C3 is formed by the third capacitor electrode 50c, which is formed on the principal surface of the eighth dielectric layer S8, and the second shield electrode 22B, which is formed on the principal surface of the ninth dielectric layer S9, whereas the fourth capacitor C4 is formed by the fourth capacitor electrode 50d and the second shield electrode 22B.

The eleventh capacitor C11 of the first parallel resonant circuit 16A is formed by the eleventh capacitor-forming electrode 24a, which is formed on the principal surface of the fourth dielectric layer S4, and the twenty-first capacitor-forming electrode 30a, which is formed on the principal surface of the sixth dielectric layer S6. The twelfth capacitor C12 of the second parallel resonant circuit 16B is formed by the twelfth capacitor-forming electrode 24b and the twenty-second capacitor-forming electrode 30b, and the thirteenth capacitor C13 of the third parallel resonant circuit 16C is formed by the thirteenth capacitor-forming electrode 24c and the twenty-third capacitor-forming electrode 30c.

Similarly, the eleventh coil L11 of the first parallel resonant circuit 16A is formed by the eleventh coil-forming electrode 26a, which is formed on the principal surface of the fourth dielectric layer S4, the via hole 38, the thirty-first coil-forming electrode 36a, which is formed on the principal surface of the fifth dielectric layer S5, the via hole 40, and the twenty-first coil-forming electrode 32a, which is formed on the principal surface of the sixth dielectric layer S6. The twelfth coil L12 of the second parallel resonant circuit 16B is formed by the twelfth coil-forming electrode 26b, the via hole 42, the thirty-second coil-forming electrode 36b, the via hole 44, and the twenty-second coil-forming electrode 32b, and the thirteenth coil L13 of the third parallel resonant circuit 16C is formed by the thirteenth coil-forming electrode 26c, the via hole 46, the thirty-third coil-forming electrode 36c, the via hole 48, and the twenty-third coil-forming electrode 32c.

The frequency characteristics of the second passive component 10B also exhibit the same characteristics as shown in FIG. 4, wherein the second attenuation pole P2 (resonant frequency fb) which is nearest to the passband is caused by the second parallel resonant circuit 16B. Apart therefrom, the first attenuation pole P1 (resonant frequency fa) and the third attenuation pole P3 (resonant frequency fc) are caused respectively by the first parallel resonant circuit 16A and the third parallel resonant circuit 16C.

Figure 7:
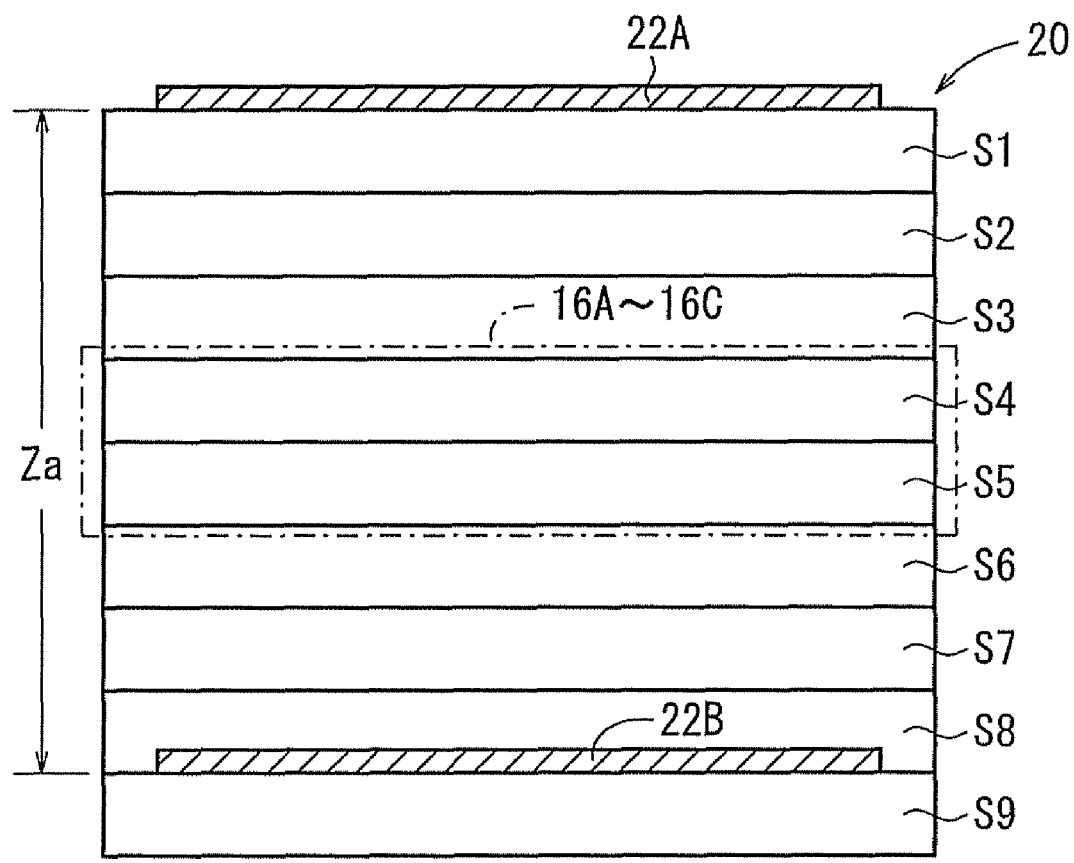
FIG. 7 is a view for explaining a position, which is farthest from a first shield electrode and a second shield electrode, in the second passive component.

In this manner, in the second passive component 10B, the first to third parallel resonant circuits 16A to 16C are formed at the following positions. More specifically, for example, as shown in FIG. 7, the second parallel resonant circuit 16B is formed within the dielectric substrate 20 at a position farthest from a first shield electrode 22A, and further, at a position farthest from a second shield electrode 22B, within a region Za sandwiched between the first shield electrode 22A and the second shield electrode 22B.

Herein, the farthest position is defined such that, in the second passive component 10B, since the number of dielectric layers which are included in the region Za is an even number (i.e., eight layers: first to eighth dielectric layers S1 to S8), the farthest position applies to the principal surface of the fifth dielectric layer S5, which is positioned at a center portion in the stacking direction of the region Za, or each of the principal surfaces of the fourth thorough sixth dielectric layers S4 to S6.

Consequently, all the first through third parallel resonant circuits 16A to 16C are less subject to the first shield electrode 22A and the second shield electrode 22B, which are formed on the upper portion and the lower portion of the dielectric substrate 20, whereby the Q-value of the first through third parallel resonant circuits 16A to 16C can be improved. Owing thereto, by forming the first through third parallel resonant circuits 16A to 16C inside of the dielectric substrate 20, an increase in insertion loss can be suppressed, the passband can be widened, and steep attenuation characteristics can be obtained. In addition, a low profile can be realized, such that the device is suitable for use in thin-bodied communication devices and electronic equipment.

In particular, because the thirty-first coil-forming electrode 36a, the thirty-second coil-forming electrode 36b and the thirty-third coil-forming electrode 36c, in which the coil length (physical length) thereof can be increased, are formed within a region Za on the principal surface of the fifth dielectric layer S5 positioned centrally in the stacking direction, while an increase in insertion loss is effectively suppressed, the inductance components of the first through third parallel resonant circuits 16A to 16C can be increased. Thus, the attenuation amount of the first to third attenuation poles P1 to P3, which are formed in the first to third parallel resonant circuits 16A to 16C, is increased, and moreover, steep bandpass characteristics can be obtained.

Further, each of the coil-forming electrodes (26a to 26c, 32a to 32c, 36a to 36c) and each of the capacitor-forming electrodes (24a to 24c, 30a to 30c) are not formed in separate dielectric layers, but rather, each of the capacitor-forming electrodes (24a to 24c, 30a to 30c) is arranged inside the orbit of each of the coil-forming electrodes (26a to 26c, 32a to 32c). Further, each of the capacitor-forming electrodes (24a to 24c, 30a to 30c) is connected to a corresponding coil-forming electrode (26a to 26c, 32a to 32c). Thus, capacitor-forming electrodes (24a to 24c, 30a to 30c) which correspond respectively to the coil-forming electrodes (26a to 26c, 32a to 32c) are formed, so that miniaturization and a low profile of the second passive component 10B can be promoted.

Further, in the second passive component 10B, between the fourth through sixth dielectric layers S4 to S6 in which the first through third parallel resonant circuits 16A to 16C are formed, and the first dielectric layer S1 on which the first shield electrode 22A is formed, the first capacitor electrode 50a at the same potential as the eleventh capacitor-forming electrode 24a is formed at a position corresponding to the eleventh capacitor-forming electrode 24a, whereas the second capacitor electrode 50b at the same potential as the twelfth capacitor-forming electrode 24b is formed at a position corresponding to the twelfth capacitor-forming electrode 24b. Furthermore, between the fourth through sixth dielectric layers S4 to S6 in which the first through third parallel resonant circuits 16A to 16C are formed, and the ninth dielectric layer S9 on which the second shield electrode 22B is formed, the third capacitor electrode 50c at the same potential as the twenty-second capacitor-forming electrode 30b is formed at a position corresponding to the twenty-second capacitor-forming electrode 30b, whereas the fourth capacitor electrode 50d at the same potential as the twenty-third capacitor-forming electrode 30c is formed at a position corresponding to the twenty-third capacitor-forming electrode 30c. Owing thereto, an effect of lowering floating (stray) capacitance is achieved, and the degree of freedom in design of the device is enhanced.

Furthermore, in the second passive component 10B, in the case that the dielectric substrate 20 is viewed from an upper surface thereof, the first through third parallel resonant circuits 16A to 16C are arranged in a row, and between the first parallel resonant circuit 16A and the second parallel resonant circuit 16B which are adjacent to each other, and between the second parallel resonant circuit 16B and the third parallel resonant circuit 16C which are adjacent to each other, the winding directions of the coil-forming electrodes thereof are opposite to each other. Owing thereto, an effect of reduction of coupling is produced, and as a result, the adjacent LC resonant circuits can be arranged in proximity to one another, whereby miniaturization of the second passive component 10B can be further promoted.

Next, the frequency characteristics of the passive component 10 according to the present embodiments (the first passive component 10A and the second passive component 10B) and a passive component according to a conventional example shall be compared. First, although not shown, the passive component according to the conventional example includes a structure in which a group of electrodes for forming a capacitor and a group of electrodes for forming a coil are separately formed respectively with respect to the stacking direction of the dielectric substrate. The bandpass characteristics of the passive component according to the conventional example, and particularly the characteristics thereof in the vicinity of the passband, are depicted by a curve shown by the broken line C in FIG. 8. In contrast thereto, in FIG. 8, the solid line A shows bandpass characteristics of the passive component 10 in accordance with the present embodiments.

Figure 8:
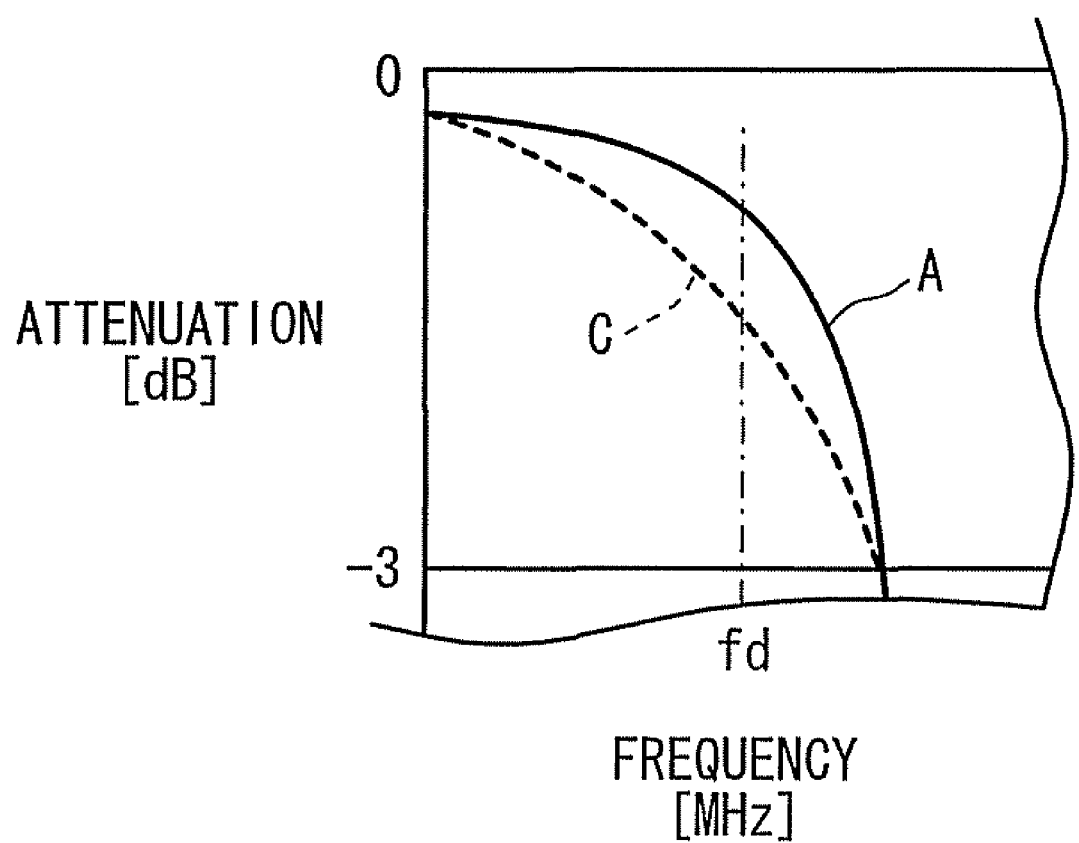
FIG. 8 is a diagram illustrating the difference in bandpass characteristics of a passive component according to the present embodiment and a passive component according to a conventional example.

As understood from FIG. 8, for example, although the attenuation amount of the conventional example in the frequency fd in the vicinity of the passband is roughly −1.5 dB, the attenuation amount of the present embodiment is roughly −1 dB. Thus, it is understood that the passband is widened, and that a steep attenuation characteristic is obtained.

As another embodiment, the capacitor-forming electrodes may be formed in a dielectric layer other than the dielectric layers in which the coil-forming electrodes are formed.

Further, the capacitor-forming electrodes may be formed outside the orbit of the coil-forming electrodes.

With the above-mentioned examples, the axial direction of the coils constituted by the coil-forming electrodes is in the upper/lower surface direction (transverse-winding) of the dielectric substrate, however, this direction may also be in a direction perpendicular to the upper/lower surface direction (vertical winding).

Further, in the above-mentioned examples, the LC resonant circuits are formed as parallel resonant circuits, however, serial resonant circuits also may be used.

The passive component according to the present invention is not limited to the aforementioned embodiments. It is a matter of course that various other structures could be adopted, which do not deviate from the essence and gist of the invention.

The invention claimed is:
1. A passive component comprising:
a dielectric substrate made up from a stack of plural dielectric layers, wherein a first shield electrode is formed on an upper portion thereof, and a second shield electrode is formed on a lower portion thereof; and
a plurality of LC resonant circuits formed in a region within the dielectric substrate, the region being sandwiched between the first shield electrode and the second shield electrode, the plurality of LC resonant circuits having different resonant frequencies; and
a plurality of ground capacitors connected in parallel to the plurality of LC resonant circuits, each of the plurality of LC resonant circuits comprising a parallel resonant circuit having one coil and one capacitor,
wherein the parallel resonant circuit has coil-forming electrodes constituting the one coil and capacitor-forming electrodes constituting the one capacitor,
the coil-forming electrodes are formed over a plurality of dielectric layers, the capacitor-forming electrodes are formed in each of two or more of the coil-forming electrodes, and in one of the LC resonant circuits that has a resonant frequency nearest to a passband, at least a coil is formed in the region sandwiched between the first shield electrode and the second shield electrode at a position farthest from the first shield electrode and the second shield electrode than a coil of other LC resonant circuits.

2. The passive component according to claim 1, wherein one of the ground capacitors is formed by a ground capacitor electrode and at least one of the first shield electrode and the second shield electrode, the ground capacitor electrode is formed between the dielectric layers in which the LC resonant circuits are formed and dielectric layer on which the one of the first shield electrode and the second shield electrode is formed, and at a position corresponding to a capacitor-forming electrode, which is at the same potential as the ground capacitor electrode.

3. The passive component according to claim 2, wherein two of the ground capacitors of the plurality of ground capacitors are connected in parallel to the LC resonant circuit having the resonant frequency nearest to a passband, a first ground capacitor of the two ground capacitors is formed by the first shield electrode and a capacitor electrode, a second ground capacitor of the two ground capacitors is formed by the second shield electrode and a second ground capacitor electrode, of the capacitor-forming electrodes constituting the capacitor of the LC resonant circuit having the resonant frequency nearest to a passband, a capacitor-forming electrode at a side of the first shield electrode is a first capacitor-forming electrode and a capacitor-forming electrode at a side of the second shield electrode is a second capacitor-forming electrode, the first ground capacitor electrode is formed between the dielectric layers in which the LC resonant circuits are formed and a dielectric layer on which the first shield electrode is formed, and at a position corresponding to the first capacitor-forming electrode which is at the same potential as the first ground capacitor electrode, and the second ground capacitor electrode is formed between the dielectric layers in which the LC resonant circuits are formed and a dielectric layer on which the second shield electrode is formed, and at a position corresponding to the second capacitor-forming electrode which is at the same potential as the second ground capacitor electrode.

* * * * *

UNITED STATES PATENT AND TRADEMARK OFFICE
CERTIFICATE OF CORRECTION

PATENT NO.        : 8,102,222 B2
APPLICATION NO.   : 12/527718
DATED             : January 24, 2012
INVENTOR(S)       : Yasuhiko Mizutani and Hitoshi Makino It is certified that error appears in the above-identified patent and that said Letters Patent is hereby corrected as shown below:

<u>Column 13</u>

*Line 15*: add --a-- before "dielectric"

*Line 25*: add --first ground-- before "capacitor"

Signed and Sealed this
Twelfth Day of June, 2012

David J. Kappos
*Director of the United States Patent and Trademark Office*